United States Patent
Pigott et al.

(10) Patent No.: US 12,231,042 B2
(45) Date of Patent: Feb. 18, 2025

(54) ISOLATION CONNECTIONS FOR HIGH-VOLTAGE POWER STAGE

(71) Applicant: NXP USA, Inc., Austin, TX (US)

(72) Inventors: John Pigott, Phoenix, AZ (US); Trevor Mark Newlin, Mesa, AZ (US)

(73) Assignee: NXP USA, Inc., Austin, TX (US)

( * ) Notice: Subject to any disclaimer, the term of this patent is extended or adjusted under 35 U.S.C. 154(b) by 243 days.

(21) Appl. No.: 17/734,993

(22) Filed: May 2, 2022

(65) Prior Publication Data

US 2023/0353050 A1    Nov. 2, 2023

(51) Int. Cl.
*H02M 3/158* (2006.01)

(52) U.S. Cl.
CPC .................. *H02M 3/158* (2013.01)

(58) Field of Classification Search
CPC .......................... H02M 3/155–1588
See application file for complete search history.

(56) References Cited

U.S. PATENT DOCUMENTS

| | | | |
|---|---|---|---|
| 8,593,128 B2 | 11/2013 | Burns et al. | |
| 9,870,939 B2 * | 1/2018 | Linewih | H01L 27/0274 |
| 9,985,526 B1 | 5/2018 | Oak | |
| 2004/0036458 A1 | 2/2004 | Johnson et al. | |
| 2009/0153127 A1 | 6/2009 | Chen | |
| 2011/0001171 A1 | 1/2011 | Nguyen | |
| 2013/0063984 A1 * | 3/2013 | Sandner | H02M 1/38 363/20 |
| 2021/0126631 A1 * | 4/2021 | Liang | H01L 29/36 |
| 2021/0391795 A1 | 12/2021 | Gandhi et al. | |

FOREIGN PATENT DOCUMENTS

| | | | |
|---|---|---|---|
| EP | 1049165 A1 | 11/2000 | |
| WO | WO-2019007331 A1 * | 1/2019 | H01L 29/06 |

OTHER PUBLICATIONS

Machine translation of WO-2019007331-A1 (Year: 2019).*
Nam, Hyunseok et al. "5-V Buck Converter Using 3.3-V Standard CMOS Process With Adaptive Power Transistor Driver Increasing Efficiency and Maximum Load Capacity", IEEE Transactions on Power Electronics, vol. 27, No. 1, Jan. 2012, pp. 463-471.

* cited by examiner

*Primary Examiner* — Peter M Novak

(57) ABSTRACT

Embodiments of a power stage for a direct current (DC)-DC converter and a DC-DC converter are disclosed. In an embodiment, a power stage for a DC-DC converter includes an input terminal from which input power of the DC-DC converter with an input DC voltage is received, a high-side segment connected between the input DC voltage and an output signal of the power stage, and a low-side segment connected between the output signal of the power stage and ground. At least one of the high-side segment and the low-side segment includes stacked transistors having isolation terminals that are biased to reduce substrate injection.

22 Claims, 3 Drawing Sheets

ISOLATION CONNECTIONS FOR HIGH-VOLTAGE POWER STAGE

BACKGROUND

A power stage can be used, for example, in a direct current (DC)-DC converter, to convert a DC power source from one voltage level to another. A high-voltage (e.g., 5 volt (V) to 36 V) power stage may be formed by a stack of lower-voltage-rated (e.g., 2.5 V or 20V) switch devices alternately enabling switch segments between either the input supply or ground and the output. Each of the stacked switch devices may have a voltage rating that is lower than the voltage rating of the power stage. However, significant substrate injection can occur during switch deadtime, which is the interval during which no switch path is turned on. Therefore, there is a need for a power stage formed by stacked switch devices in which isolation connections of switch devices are appropriately biased to reduce or minimize effects of substrate injection, while preserving circuit operating efficiency and avoiding overvoltage stresses on the stacked switch devices.

SUMMARY

Embodiments of a power stage for a DC-DC converter and a DC-DC converter are disclosed. In an embodiment, a power stage for a DC-DC converter includes an input terminal from which input power of the DC-DC converter with an input DC voltage is received, a high-side segment connected between the input DC voltage and an output signal of the power stage, and a low-side segment connected between the output signal of the power stage and ground. At least one of the high-side segment and the low-side segment includes stacked transistors having isolation terminals that are biased to reduce substrate injection. Other embodiments are also described.

In an embodiment, one of the stacked transistors has an isolation terminal that is connected to the input DC voltage.

In an embodiment, one of the stacked transistors has an isolation terminal that is connected to a boot voltage, which is connected to an output signal of the power stage via a capacitor.

In an embodiment, one of the stacked transistors has an isolation terminal that is connected to a Schottky diode or a Zener diode.

In an embodiment, one of the stacked transistors has an isolation terminal that is connected to ground.

In an embodiment, the stacked transistors include field effect transistors (FETs).

In an embodiment, the FETs include a first FET having a drain terminal that is connected to the input DC voltage and a second FET having a drain terminal that is connected to a source terminal of the first FET.

In an embodiment, the first FET has an isolation terminal that is connected to the input DC voltage.

In an embodiment, the first FET has an isolation terminal that is connected to a source terminal of a third FET.

In an embodiment, the second FET has an isolation terminal that is connected to a boot voltage, which is connected to an output signal of the power stage via a capacitor.

In an embodiment, the FETs further include a first FET having a drain terminal that is connected to the output signal of the power stage and a second FET having a drain terminal that is connected to a source terminal of the first FET and a source terminal that is connected to ground.

In an embodiment, the first FET has an isolation terminal that is connected to a Schottky diode or a Zener diode.

In an embodiment, the second FET has an isolation terminal that is connected to ground or a positive fixed voltage.

In an embodiment, a high-voltage (HV) power stage for a DC-DC converter includes an input terminal from which input power of the DC-DC converter with an input direct current (DC) voltage is received, a high-side segment connected between the input DC voltage and an output signal of the HV power stage, and a low-side segment connected between the output signal of the HV power stage and ground. Each of the high-side segment and the low-side segment includes stacked transistors having isolation terminals that are biased to reduce substrate injection.

In an embodiment, the stacked transistors of the high-side segment include a first LV N-channel FET having a drain terminal that is connected to the input DC voltage and a second LV N-channel FET having a drain terminal that is connected to a source terminal of the first LV N-channel FET. The stacked transistors of the low-side segment include a third LV N-channel FET having a drain terminal that is connected to a source terminal of the second LV N-channel FET and a fourth LV N-channel FET having a drain terminal that is connected to a source terminal of the third LV N-channel FET and a source terminal that is connected to ground.

In an embodiment, the first LV N-channel FET has an isolation terminal that is connected to the input DC voltage.

In an embodiment, the second LV N-channel FET has an isolation terminal that is connected to a boot voltage, which is connected to an output signal of the HV power stage via a capacitor.

In an embodiment, the third LV N-channel FET has an isolation terminal that is connected to a Schottky diode or a Zener diode.

In an embodiment, the fourth LV N-channel FET has an isolation terminal that is connected to ground.

In an embodiment, a DC-DC converter includes a power stage including an input terminal from which input power of the DC-DC converter with an input direct current (DC) voltage is received, a high-side segment connected between the input DC voltage and an output signal of the power stage and a low-side segment connected between the output signal of the power stage and ground, and an inductor-capacitor (LC) network connected to the power stage. At least one of the high-side segment and the low-side segment includes stacked transistors having isolation terminals that are biased to reduce substrate injection. The power stage and the LC network are configured to convert the input power with the input DC voltage into an output signal with an output DC voltage.

Other aspects in accordance with the invention will become apparent from the following detailed description, taken in conjunction with the accompanying drawings, illustrated by way of example of the principles of the invention.

BRIEF DESCRIPTION OF THE DRAWINGS

Throughout the description, similar reference numbers may be used to identify similar elements.

DETAILED DESCRIPTION

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

Figure 1:
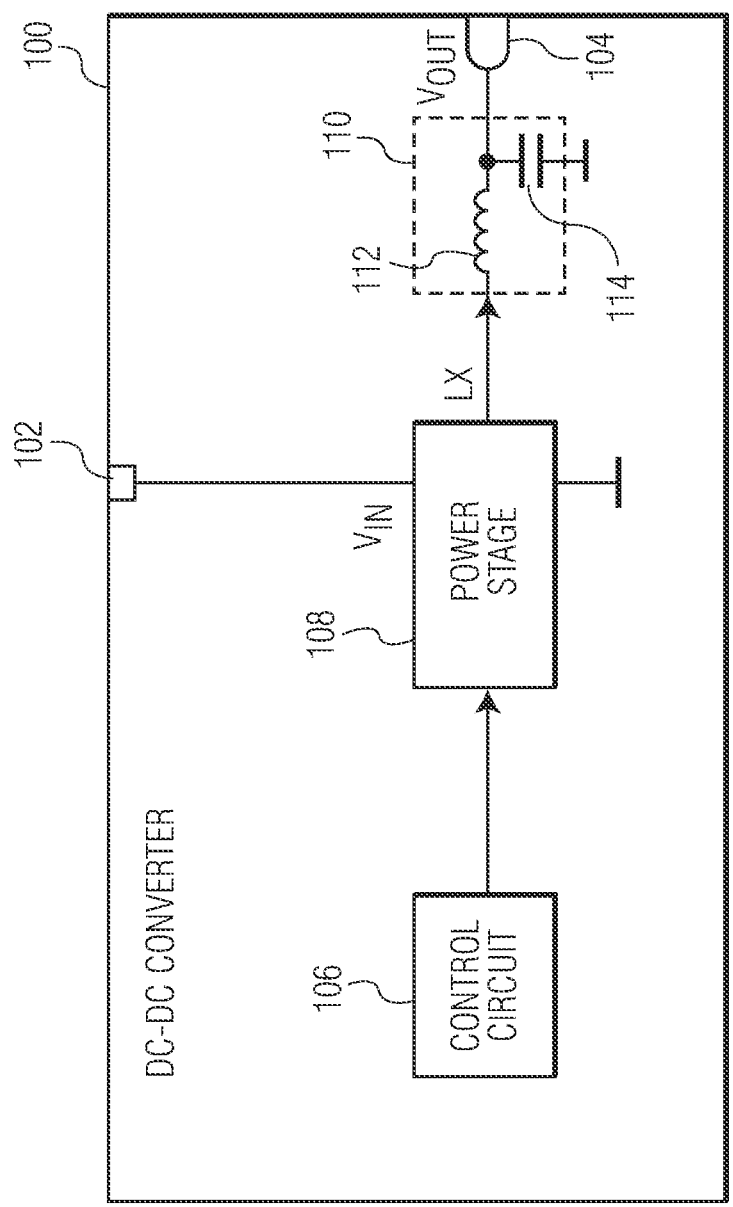
FIG. 1 is a schematic block diagram of a DC-DC converter in accordance with an embodiment of the invention.

FIG. 1 is a schematic block diagram of a DC-DC converter 100 in accordance with an embodiment of the invention. The DC-DC converter converts input power with an input DC voltage, $V_{in}$, which is received from an input electrical terminal or node 102 into an output signal with a desired output DC voltage, $V_{out}$, which is output from an output electrical terminal or node 104. The DC-DC converter can be used in various applications, such as automotive applications, communications applications, industrial applications, medical applications, computer applications, and/or consumer or appliance applications. In the embodiment depicted in FIG. 1, the DC-DC converter includes a control circuit 106, a power stage 108, and an inductor-capacitor (LC) network 110. In some embodiments, the DC-DC converter is included in a computing device, such as a smartphone, a tablet computer, a laptop, etc. In some embodiments, the DC-DC converter is implemented in a substrate, such as a semiconductor wafer. In an embodiment, the DC-DC converter is constructed as a stand-alone semiconductor IC chip. In some embodiments, the DC-DC converter is a Buck DC-DC converter in which the input voltage, $V_{IN}$, is higher than the output voltage, $V_{OUT}$. Although the DC-DC converter is shown in FIG. 1 as including certain circuit elements, in other embodiments, the DC-DC converter may include one or more additional circuit elements. For example, although the DC-DC converter is shown in FIG. 1 as an inductive DC-DC converter and including the LC network 110, in other embodiments, the DC-DC converter is a switched capacitor DC-DC converter and does not include the LC network 110.

In the embodiment depicted in FIG. 1, the control circuit 106 is configured to control the operation of the power stage 108. The control circuit may include a transconductance amplifier, a comparator, and/or a multiplexer.

In the embodiment depicted in FIG. 1, the power stage 108 is connected to the input electrical terminal 102 that is configured to receive the input DC signal with the input voltage, $V_{IN}$, to the ground, and to the LC network 110. In some embodiments, the power stage 108 and the LC network 110 are configured to convert the input DC signal with the input voltage, $V_{IN}$, into the output DC signal with the output voltage, $V_{OUT}$, using stacked semiconductor devices (e.g., stacked transistors, such as, field effect transistors (FETs)) that may be connected in series) in at least one switch segment. In some embodiments, the power stage 108 is constructed as a semiconductor IC chip. For example, the power stage 108 is constructed as a first semiconductor IC chip, while the control circuit 106 and/or the LC network 110 is constructed as a second semiconductor IC chip. In some embodiments, the control circuit 106, the power stage 108, and the LC network 110 are constructed in the substrate of the same semiconductor IC chip. In the embodiment depicted in FIG. 1, the output signal, LX, of the power stage 108 is input into the LC network 110. The power stage 108 can be used in an inductive DC-DC converter or a switched capacitor DC-DC converter.

In the embodiment depicted in FIG. 1, the LC network 110 is connected to the output electrical terminal 104 from which the output DC signal with the output voltage, $V_{OUT}$, is output. The LC network 110 includes an inductor 112 and a capacitor 114. Although the LC network 110 is shown in FIG. 1 as including certain circuit elements, in other embodiments, the LC network 110 may be implemented differently from the embodiment depicted in FIG. 1.

Figure 2:
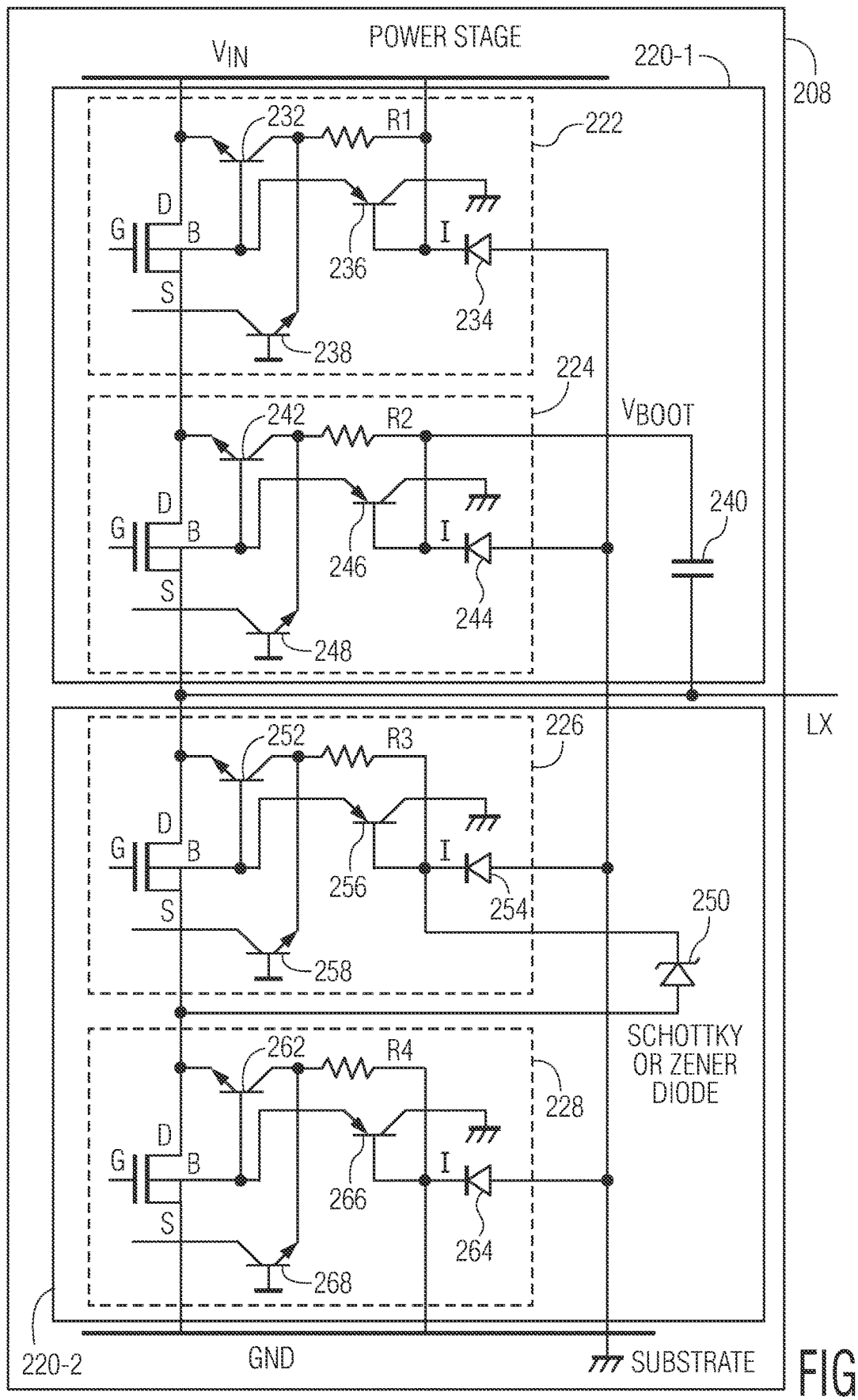
FIG. 2 depicts an embodiment of the power stage of the DC-DC converter depicted in FIG. 1.

FIG. 2 depicts a power stage 208, which is an embodiment of the power stage 108 depicted in FIG. 1. In the embodiment depicted in FIG. 2, the power stage 208 is a high-voltage (HV) power stage that includes four lower-voltage rated FETs 222, 224, 226, 228 that are in a high-side (HS) segment 220-1 connected between the input DC voltage, $V_{IN}$, and the output signal, LX, of the power stage 208 or a low-side (LS) segment 220-2 connected between the output signal, LX, of the power stage 208 and ground. Although the power stage 208 is shown in FIG. 2 as including four FETs, in other embodiments, the power stage 208 includes more than four FETs or fewer than four FETs. In addition, although each of the high-side (HS) and the low-side (LS) segments of the power stage 208 is shown in FIG. 2 as including two FETs, in other embodiments, one of the high-side (HS) segment 220-1 and the low-side (LS) segment 220-2 of the power stage 208 includes two or more FETs. For example, the high-side (HS) segment 220-1 of the power stage 208 includes two stacked FETs, while the low-side (LS) segment 220-2 of the power stage 208 includes only one FET. In another example, the low-side (LS) segment 220-2 of the power stage 208 includes two stacked FETs, while the high-side (HS) segment 220-1 of the power stage 208 includes only one FET. The power stage 208 can be used in high-voltage (HV) applications in which the FET drain-source voltage, $V_{DS}$, capability is much higher than the FET gate-source voltage, $V_{GS}$ capability. In some embodiments, the input voltage, $V_{IN}$, is at 36V, and each of the FETs 222, 224, 226, 228 has a voltage rating ($V_{DS,MAX}$) of 20V or 24V. In the embodiment depicted in FIG. 2, in addition to gate (G), source (S), and drain (D) terminals, each of the FETs 222, 224, 226, 228 has an isolation (Iso) connection or terminal (I) to isolate the respective FET from other device(s) constructed in the same substrate and to collect currents generated from drain-substrate PN junction forward bias. Each of the FETs 222, 224, 226, 228 also has a limitation on the maximum voltage allowed between its isolation and body or bulk terminals. In the embodiment depicted in FIG. 2, the Iso terminals of the FETs 222, 224, 226, 228 are connected to voltages that reduce or minimize effects of substrate injection, while preserving circuit operating efficiency and avoiding over-voltage stresses on the FETs 222, 224, 226, 228. The power stage 208 depicted in FIG. 2 is one possible embodiment of the power stage 108 depicted in FIG. 1. However, the power stage 108 depicted in FIG. 1 is not limited to the embodiment shown in FIG. 2.

In the embodiment depicted in FIG. 2, the high-side (HS) segment 220-1 includes stacked FETs 222, 224 connected between the input DC voltage, $V_{IN}$, and the output signal, LX, of the power stage 208. The individual maximum voltage rating of the FETs 222, 224 does not meet the maximum voltage rating required for the high-side (HS) segment 220-1 (approximately $V_{IN}$). The low-side (LS) segment 220-2 includes stacked FETs 226, 228 connected between the output signal, LX, of the power stage 208 and ground. The individual maximum voltage rating of the FETs 226, 228 does not meet the maximum voltage rating required for the low-side (LS) segment 220-2 (approximately $V_{IN}$).

In the embodiment depicted in FIG. 2, the FET 222 is an N-channel or N-type high-side (HS) FET that has a drain terminal (D) connected to the input DC signal with the input voltage, $V_{IN}$, a source terminal (S) connected to a drain terminal (D) of the FET 224, and a body or bulk terminal (B) connected to the source terminal (S) of the FET 222. In the embodiment depicted in FIG. 2, the FET 222 has an isolation terminal (I) that is connected to the input DC signal with the input voltage, $V_{IN}$. A parasitic NPN transistor 232 with a parasitic resistor R1 is formed between the body or bulk terminal (B), the drain terminal (D), and the isolation terminal (I) of the FET 222. A parasitic PNP transistor 236 is formed between the body or bulk terminal (B) and the isolation terminal (I) of the FET 222. A parasitic NPN transistor 238 is formed between the source terminal (S) of the FET 222 and the parasitic NPN transistor 232. A parasitic diode 234 is formed between the substrate and the isolation terminal (I) of the FET 222 of the power stage 208. The voltage at the isolation terminal (I) of the FET 222 may be between 18V and 36V. By biasing the isolation terminal (I) of the FET 222, the parasitic NPN transistors 232, 238 and the parasitic PNP transistor 236 can be prevented from being turned on to minimize the power dissipation, to avoid performance degradation from substrate injection, and to avoid excessive voltage between the isolation terminal (I) and the source terminal (S) and the body or bulk terminal (B) of the FET 222.

In the embodiment depicted in FIG. 2, the FET 224 is an N-channel or N-type high-side (HS) FET that has a drain terminal (D) connected to the source terminal (S) of the FET 222, a source terminal (S) connected to a drain terminal (D) of the FET 226, and a body or bulk terminal (B) connected to the source terminal (S) of the FET 224. In the embodiment depicted in FIG. 2, the FET 224 has an isolation terminal (I) that is connected to a boot voltage, VBOOT. A parasitic NPN transistor 242 with a parasitic resistor R2 is formed between the body or bulk terminal (B), the drain terminal (D), and the isolation terminal (I) of the FET 224. A parasitic PNP transistor 246 is formed between the body or bulk terminal (B) and the isolation terminal (I) of the FET 224. A parasitic NPN transistor 248 is formed between the source terminal (S) of the FET 224 and the parasitic NPN transistor 242. A parasitic diode 244 is formed between the substrate and the isolation terminal (I) of the FET 224 of the power stage 208. The boot voltage, VBOOT, may be connected to the output signal, LX, of the power stage 208 via a capacitor 240. In some embodiments, with a load current, during a deadtime of the FET 224, the bulk-drain junction within the FET 224 is forward biased, and the boot voltage, VBOOT, stored on the capacitor 240 is discharged. The voltage at the isolation terminal (I) of the FET 224 may swing between 5V and 41V in each switch cycle. By biasing the isolation terminal (I) of the FET 224, the parasitic NPN transistors 242, 248 and the parasitic PNP transistor 246 can be controlled (e.g., prevented from being turned on) to minimize the power dissipation, to avoid performance degradation from substrate injection, and to avoid excessive voltage between the isolation terminal (I) and the source terminal (S) and the body or bulk terminal (B) of the FET 224.

In the embodiment depicted in FIG. 2, the FET 226 is an N-channel or N-type low-side (LS) FET that has a drain terminal (D) connected to the source terminal (S) of the FET 224, a source terminal (S) connected to a drain terminal (D) of the FET 228, and a body terminal (B) connected to the source terminal (S) of the FET 226. In the embodiment depicted in FIG. 2, the FET 226 has an isolation terminal (I) that is connected to a diode 250, which may be a Schottky diode or a Zener diode. A parasitic NPN transistor 252 with a parasitic resistor R3 is formed between the body or bulk terminal (B), the drain terminal (D), and the isolation terminal (I) of the FET 226. A parasitic PNP transistor 256 is formed between the body or bulk terminal (B) and the isolation terminal (I) of the FET 226. A parasitic NPN transistor 258 is formed between the source terminal (S) of the FET 226 and the parasitic NPN transistor 252. A parasitic diode 254 is formed between the substrate and the isolation terminal (I) of the FET 226 of the power stage 208. In the embodiment depicted in FIG. 2, the Schottky or Zener diode 250 is connected to the source terminal (S) of the FET 226, for example, to pull up the isolation terminal (I) of the FET 226 and to bypass the base and the emitter of the parasitic PNP transistor 256, thus preventing the parasitic PNP transistor 256 from turning on. In some embodiments, the anode of the Schottky or Zener diode 250 is connected to a fixed voltage, for example, 5 volts (V). In some embodiments, the isolation terminal (I) of the FET 226 is connected to a fixed voltage that is greater than input DC voltage, $V_{in}$, to collect current injected by the FET 228. By biasing the isolation terminal (I) of the FET 226, the parasitic NPN transistors 252, 258 and the parasitic PNP transistor 256 can be prevented from failing to be turned on to minimize the power dissipation, to avoid performance degradation from substrate injection, and to avoid excessive voltage between the isolation terminal (I) and the source terminal (S) and the body or bulk terminal (B) of the FET 226.

In the embodiment depicted in FIG. 2, the FET 228 is an N-channel or N-type low-side (LS) FET that has a drain terminal (D) connected to the source terminal (S) of the FET 226, a source terminal (S) connected to a fixed voltage, for example, the ground (zero volt), and a body or bulk terminal (B) connected to the source terminal (S) of the FET 228. In the embodiment depicted in FIG. 2, the FET 228 has an isolation terminal (I) that is connected to the ground (zero volts). A parasitic NPN transistor 262 with a parasitic resistor R4 is formed between the body or bulk terminal (B), the drain terminal (D), and the isolation terminal (I) of the FET 228. A parasitic PNP transistor 266 is formed between the body or bulk terminal (B) and the isolation terminal (I) of the FET 228. A parasitic NPN transistor 268 is formed between the source terminal (S) of the FET 228 and the parasitic NPN transistor 262. A parasitic diode 264 is formed between the substrate and the isolation terminal (I) of the FET 228 of the power stage 208. When the isolation terminal (I) of the FET 228 is connected to the ground, injected current is efficiently collected only to a certain level, and, at injection levels higher than that level, injected carriers may propagate to adjacent regions. In some embodiments, the isolation terminal (I) of the FET 228 is connected to a fixed positive voltage, which can have better collection but worse power dissipation. By biasing the isolation terminal (I) of the FET 228, the parasitic NPN transistor 268 and the parasitic PNP transistor 266 can be prevented from failing to be turned on to minimize the power dissipation, to avoid performance degradation from substrate injection, and to avoid excessive voltage between the isolation terminal (I) and the source terminal (S) and the body or bulk terminal (B) of the FET 228.

In the power stage 208 depicted in FIG. 2, the connection or the voltage bias of the isolation terminals (I) of the FETs 222, 224, 226, 228 may be independent from each other. For example, the isolation terminal (I) of the FET 222 is connected to the input DC signal with the input voltage, $V_{IN}$, as depicted in FIG. 2, while the connection or the voltage bias of the isolation terminals (I) of the FETs 224, 226, 228 are different from the connection or the voltage bias as depicted in FIG. 2. In another example, the isolation terminal (I) of the FET 224 is connected to the boot voltage, VBOOT, as depicted in FIG. 2, while the connection or the voltage bias of the isolation terminals (I) of the FETs 222, 226, 228 are different from the connection or the voltage bias as depicted in FIG. 2. In another example, the isolation terminal (I) of the FET 226 is connected to the Schottky or Zener diode 250 as depicted in FIG. 2, while the connection or the voltage bias of the isolation terminals (I) of the FETs 222, 224, 228 are different from the connection or the voltage bias as depicted in FIG. 2. In another example, the isolation terminal (I) of the FET 228 is connected to ground as depicted in FIG. 2, while the connection or the voltage bias of the isolation terminals (I) of the FETs 222, 224, 226 are different from the connection or the voltage bias as depicted in FIG. 2. In some embodiments, the isolation terminals (I) of the HS FETs 222, 224 are connected as depicted in FIG. 2, while the isolation terminals (I) of the LS FETs 226, 228 are connected differently from the manner as depicted in FIG. 2. In some embodiments, the isolation terminals (I) of the LS FETs 226, 228 are connected as depicted in FIG. 2, while the isolation terminals (I) of the HS FETs 222, 224 are connected differently from the manner as depicted in FIG. 2. In some embodiments, the power stage 208 only includes one LS FET, and the isolation terminals (I) of the HS FETs 222, 224 are connected as depicted in FIG. 2. In some embodiments, the power stage 208 only includes one HS FET, and the isolation terminals (I) of the LS FETs 226, 228 are connected as depicted in FIG. 2.

In the embodiment depicted in FIG. 2, gate terminals (G) of the FETs 222, 224, 226, 228 may be connected to different voltages and are driven by different signals (e.g., pulse-width modulation (PWM) signals).

Figure 3:
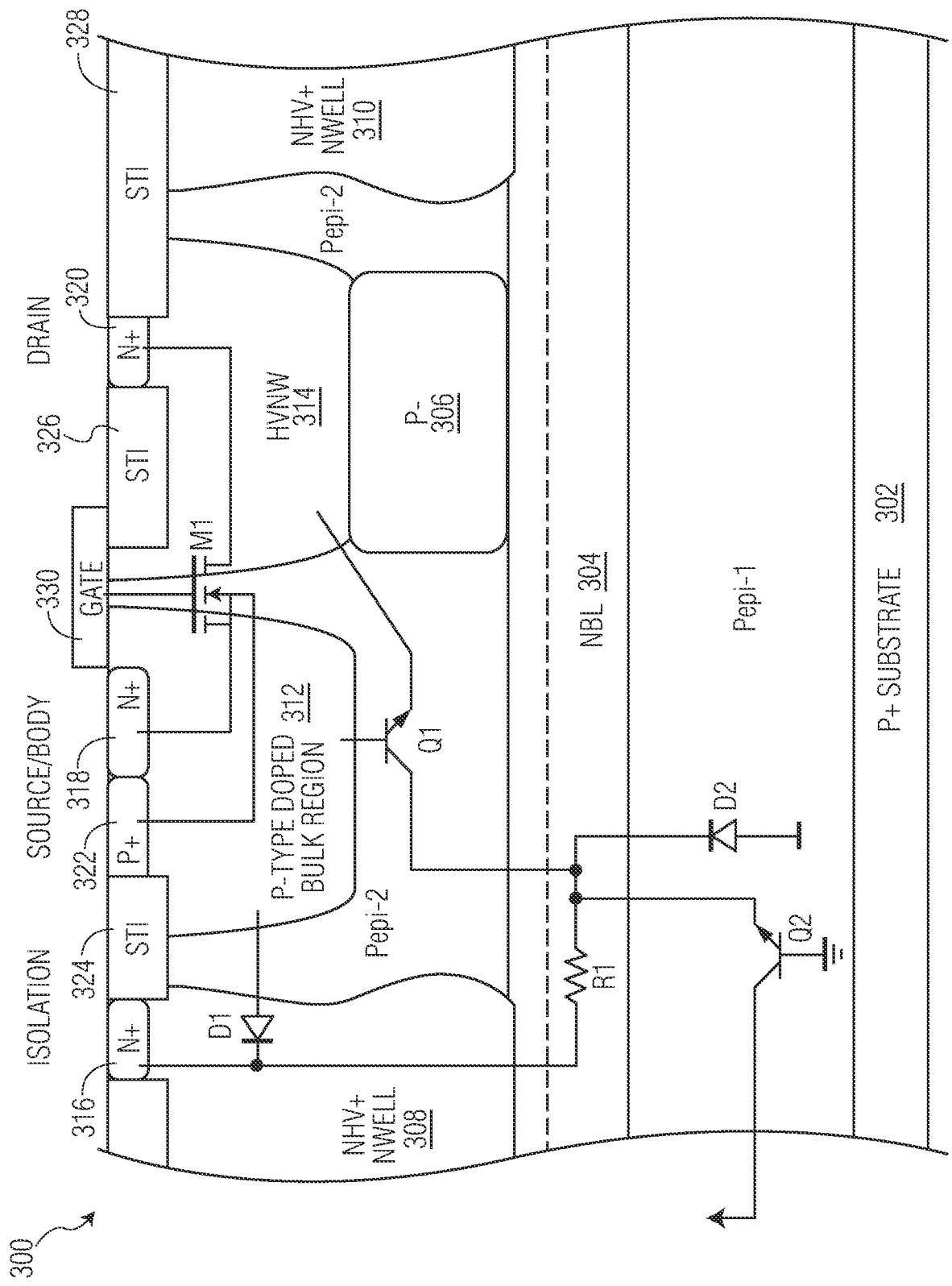
FIG. 3 depicts a cross section of an embodiment of field effect transistors (FETs) of the power stage depicted in FIG. 2.

FIG. 3 depicts a cross section of a FET 300, which is an embodiment of the FETs 222, 224, 226, 228 of the power stage 208 depicted in FIG. 2. The FET 300 depicted in FIG. 3 is one possible embodiment of the FETs 222, 224, 226, 228 of the power stage 208 depicted in FIG. 2. However, the FETs 222, 224, 226, 228 of the power stage 208 depicted in FIG. 2 are not limited to the embodiment shown in FIG. 3. In the embodiment depicted in FIG. 3, the FET 300 is formed on a P+ substrate layer 302 and includes a first epitaxially grown P-type region labeled "Pepi-1," an n-buried layer (NBL) 304, a second epitaxially grown P-type region labeled "Pepi-2," a P– region 306, N-well regions 308, 310, p-type doped bulk region 312, a high voltage n-type well (HVNW) region 314, N+ regions 316, 318, 320, a P+ region 322, shallow trench isolation (STI) regions 324, 326, 328, and a gate region 330. In the embodiment depicted in FIG. 3, the N+ region 316 connects to an isolation terminal of the FET 300, the P+ region 322 forms a body terminal of the FET 300, the N+ region 318 forms a source terminal of the FET 300, and the N+ region 320 forms a drain terminal of the FET 300. A "main" metal-oxide-semiconductor field-effect transistor (MOSFET) M1 operates within the FET 300. An NPN transistor is between the drain terminal (as an emitter), the bulk terminal (or a base) and the Isolation terminal (as a collector). Parasitic diodes D1, D2 and a parasitic resistor R1 exist in the FET 300 between various regions. When the drain-bulk junction is forward biased (e.g., in an LS FET (e.g., the FET 228 depicted in FIG. 2), the bulk region is connected to GND, the drain can be at, for example, about –0.7V when this condition occurs), current flows from the drain region to the bulk region, but also (through NPN action), current is collected at the isolation terminal. In some embodiments, the intent of the isolation connection for the FET 300 is to connect this isolation terminal to GND such that the VCE (the voltage measured between the collector and emitter) of the parasitic NPN (Q1) is low and power dissipation is low. If there is a risk that the parasitic NBL resistance is too high (thus forward biasing a second parasitic NPN Q2), this isolation connection can instead be connected to a convenient higher voltage (e.g., higher than 0V (GND)). Although the FET 300 is shown in FIG. 3 as including certain circuit elements, in other embodiments, the FET may include one or more additional circuit elements.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A power stage for a direct current (DC)-DC converter, the power stage comprising:
   an input terminal coupled to receive an input DC voltage;
   a high-side segment connected between the input terminal and an output terminal of the power stage; and
   a low-side segment connected between the output terminal of the power stage and a ground on a substrate;

wherein at least one of the high-side segment and the low-side segment comprises a set of stacked transistors embedded in the substrate;
wherein each stacked transistor has a set of input and output terminals and a separate isolation terminal;
wherein each separate isolation terminal is coupled to a different circuit element within the power stage; and
wherein the isolation terminal for each stacked transistor is separated from the set of input and output terminals for each stacked transistor by a set of parasitic elements.

2. The power stage of claim 1,
wherein the separate isolation terminal of one of the stacked transistors is connected to the input terminal.

3. The power stage of claim 1,
wherein the separate isolation terminal of one of the stacked transistors is connected to the output terminal via a capacitor.

4. The power stage of claim 1,
wherein the separate isolation terminal of one of the stacked transistors is connected to one of the input and output terminals of another one of the stacked transistors via a Schottky diode or a Zener diode.

5. The power stage of claim 1,
wherein the separate isolation terminal of one of the stacked transistors is connected to the ground on the substrate.

6. The power stage of claim 1 further comprising,
an inductor-capacitor (LC) network connected to the power stage,
wherein the power stage and the LC network are configured to convert the input power with the input DC voltage into an output signal with an output DC voltage.

7. The power stage of claim 1,
wherein the stacked transistors comprise a plurality of field effect transistors (FETs).

8. The power stage of claim 7,
wherein the FETs comprise:
a first FET having a drain terminal that is connected to the input terminal; and
a second FET having a drain terminal that is connected to a source terminal of the first FET.

9. The power stage of claim 8,
wherein the first FET includes an isolation terminal that is connected to the input terminal.

10. The power stage of claim 8,
wherein the second FET includes an isolation terminal that is connected to the output terminal via a capacitor.

11. The power stage of claim 7,
wherein the FETs further comprise:
a first FET having a drain terminal that is connected to the output signal terminal of the power stage; and
a second FET having a drain terminal that is connected to a source terminal of the first FET and a source terminal that is connected to the ground on the substrate.

12. The power stage of claim 11,
wherein the first FET includes an isolation terminal that is connected to one of the output terminals of the second FET via a Schottky diode or a Zener diode.

13. The power stage of claim 11,
wherein the second FET includes an isolation terminal that is connected to the ground or configured to be coupled to a positive fixed voltage.

14. The power stage of claim 1,
wherein a first one of the stacked transistors includes an isolation terminal that is connected to the input terminal; and
wherein a second one of the stacked transistors includes an isolation terminal that is connected to the output terminal via a capacitor.

15. The power stage of claim 14,
wherein a third one of the stacked transistors includes an isolation terminal that is connected to one of the input and output terminals of a fourth one of the stacked transistors via a Schottky diode or a Zener diode.

16. The power stage of claim 15,
wherein the fourth one of the stacked transistors includes an isolation terminal that is connected to the ground.

17. A high-voltage (HV) power stage for a direct current (DC)-DC converter, the HV power stage comprising:
an input terminal coupled to receive an input DC voltage;
a high-side segment connected between the input terminal and an output terminal of the HV power stage; and
a low-side segment connected between the output terminal of the HV power stage and a ground on a substrate;
wherein each of the high-side segment and the low-side segment comprises a set of stacked transistors embedded in the substrate;
wherein each stacked transistor has a set of input and output terminals and a separate isolation terminal;
wherein each separate isolation terminal is coupled to a different circuit element within the power stage; and
wherein the isolation terminal for each stacked transistor is separated from the set of input and output terminals by a set of parasitic elements.

18. The HV power stage of claim 17,
wherein the stacked transistors of the high-side segment comprise:
a first LV N-channel FET having a drain terminal that is connected to the input terminal; and
a second LV N-channel FET having a drain terminal that is connected to a source terminal of the first LV N-channel FET, and wherein the stacked transistors of the low-side segment comprise:
a third LV N-channel FET having a drain terminal that is connected to a source terminal of the second LV N-channel FET; and
a fourth LV N-channel FET having a drain terminal that is connected to a source terminal of the third LV N-channel FET and a source terminal that is connected to the ground.

19. The HV power stage of claim 18,
wherein the first LV N-channel FET includes an isolation terminal that is connected to the input terminal.

20. The HV power stage of claim 18,
wherein the second LV N-channel FET includes an isolation terminal that is connected to the output terminal via a capacitor.

21. The HV power stage of claim 18,
wherein the third LV N-channel FET includes an isolation terminal that is connected to one of the output terminals of the fourth LV N-channel FET via a Schottky diode or a Zener diode.

22. The HV power stage of claim 18,
wherein the fourth LV N-channel FET includes an isolation terminal that is connected to the ground.

* * * * *